United States Patent
Joo

(10) Patent No.: US 6,778,428 B2
(45) Date of Patent: Aug. 17, 2004

(54) MAGNETIC RANDOM ACCESS MEMORY (MRAM) CELLS INCLUDING AN ACCESS TRANSISTOR AND A BIT LINE THAT ARE CONNECTED TO A TERMINAL OF A MAGNETIC RESISTOR, AND METHODS OF OPERATING SAME

(75) Inventor: Jae-Hyun Joo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/421,322

(22) Filed: Apr. 23, 2003

(65) Prior Publication Data

US 2003/0206453 A1 Nov. 6, 2003

(30) Foreign Application Priority Data

Apr. 30, 2002 (KR) ................................ 10-2002-0023653

(51) Int. Cl.[7] ................................................ G11C 11/00
(52) U.S. Cl. ...................... 365/158; 365/171; 365/173
(58) Field of Search .............................. 365/158, 171, 365/173

(56) References Cited

U.S. PATENT DOCUMENTS

| | | |
|---|---|---|
| 5,838,608 A | 11/1998 | Zhu et al. |
| 6,266,289 B1 | 7/2001 | Dubovik et al. |
| 6,324,093 B1 | 11/2001 | Perner et al. |
| 6,349,054 B1 | 2/2002 | Hidaka |
| 6,359,805 B1 | 3/2002 | Hidaka |
| 6,418,046 B1 | 7/2002 | Naji |
| 6,436,526 B1 | 8/2002 | Odagawa et al. |
| 6,490,217 B1 | 12/2002 | DeBrosse et al. |
| 6,549,455 B2 * | 4/2003 | Yamada ...................... 365/171 |
| 6,625,057 B2 * | 9/2003 | Iwata .......................... 365/158 |

* cited by examiner

Primary Examiner—Huan Hoang
(74) Attorney, Agent, or Firm—Myers Bigel Sibley & Sajovec

(57) ABSTRACT

MRAM cells include a magnetic resistor having first and second terminals, and access transistor that is connected to the first terminal, and a bit line that also is connected to the first terminal. A reading word line is connected to the second terminal, and a word line is connected to the access transistor. The first terminal may include a conductive axis and the magnetic resistor at least partially surrounds the conductive axis. The MRAM cell may be written by turning on the access transistor to force writing current into the first terminal, and thereby change the resistance of the magnetic resistor. Reading may be performed by applying voltage between the bit line and the reading word line, and sensing current through the magnetic resistor in response.

28 Claims, 4 Drawing Sheets

US 6,778,428 B2

MAGNETIC RANDOM ACCESS MEMORY (MRAM) CELLS INCLUDING AN ACCESS TRANSISTOR AND A BIT LINE THAT ARE CONNECTED TO A TERMINAL OF A MAGNETIC RESISTOR, AND METHODS OF OPERATING SAME

RELATED APPLICATION

This application claims the benefit of Korean Patent Application No. 2002-0023653, filed Apr. 30, 2002, the disclosure of which is hereby incorporated herein by reference in its entirety as if set forth fully herein.

FIELD OF THE INVENTION

This invention relates to integrated circuit memory devices and operating methods thereof, and more particularly to Magnetic Random Access Memory Cells (MRAM) and operating methods thereof.

BACKGROUND OF THE INVENTION

MRAMs have been widely investigated and used as nonvolatile memory devices that can be operated at low voltage and at high speed. In an MRAM cell, data is stored in a magnetic resistor, also referred to as a Magnetic Tunnel Junction (MTJ) that includes first and second ferromagnetic layers and a tunneling insulation layer therebetween. In some embodiments, the magnetic polarization of the first ferromagnetic layer, also referred to as a free layer, is changed utilizing a magnetic field that crosses the MTJ. The magnetic field may be induced by an electric current passing around the MTJ, and the magnetic polarization of the free layer can be parallel or anti-parallel to the magnetic polarization of the second ferromagnetic layer, also referred to as a pinned layer. According to spintronics based on quantum mechanics, a tunneling current passing through the MTJ in the parallel direction may be greater than that in the anti-parallel direction. Thus, the magnetic polarizations of the free layer and the pinned layer can define the electrical resistance of the magnetic resistor, to provide an indication of the stored information in the MRAM.

It is known to provide an MRAM cell that comprises a magnetic resistor and a diode that are serially connected. See, for example, U.S. Pat. No. 5,838,608 to Zhu et al., entitled Multi-Layer Magnetic Random Access Memory and Method for Fabricating Thereof.

It is also known to provide MRAM cells that include a transistor and a magnetic resistor. See, for example U.S. Pat. No. 6,324,093 to Perner et al. entitled Write-Once Thin-Film Memory; U.S. Pat. No. 6,349,054 to Hidaka entitled Thin Film Magnetic Memory Device Including Memory Cells Having a Magnetic Tunnel Junction; U.S. Pat. No. 6,359,805 to Hidaka entitled Thin Film Magnetic Memory Device Capable of Easily Controlling a Data Write Current; U.S. Pat. No. 6,418,046 to Naji entitled MRAM Architecture and System; and U.S. Pat. No. 6,490,217 to Debrosse et al. entitled Select Line Architecture for Magnetic Random Access Memories.

In many MRAM cells, the magnetic resistor is a planar magnetic resistor, which includes planar ferromagnetic layers and a planar insulating layer therebetween. See, for example, the above-cited patents to Perner et al. and Hidaka. It may be difficult to shrink a planar magnetic resistor to provide higher integration density due to the reduced spins at the edges of the ferromagnetic layers due to defects therein. This phenomena is often called the "edge effect" or the "shape effect".

It is also known to use nonplanar magnetic resistors in MRAMs. See, for example, U.S. Pat. No. 6,436,526 to Odagawa et al. entitled Magneto-Resistance Effect Element, Magneto-Resistance Effect Memory Cell, MRAM and Method for Performing Information Write to or Read From the Magneto-Resistance Effect Memory Cell at Column 18, lines 34–36, and U.S. Pat. No. 6,266,289 to Dubovik et al. entitled Method of Toroid Write and Read, Memory Cell and Memory Device for Realizing the Same.

SUMMARY OF THE INVENTION

Some embodiments of the present invention provide MRAM cells that comprise a magnetic resistor including first and second terminals, an access transistor that is connected to the first terminal, and a bit line that also is connected to the first terminal. A reading word line is connected to the second terminal, and a word line is connected to the access transistor. In other embodiments, the access transistor includes a controlling electrode, such as a field effect transistor (FET) gate, and first and second controlled electrodes, such as an FET source and drain, wherein the word line is connected to the controlling electrode (gate), and the first terminal and the bit line are connected to the second controlled electrode (drain). In other embodiments, the bit line extends along a first direction and the word line and the reading word line extend along a second direction that is different from the first direction. In still other embodiments, the first terminal comprises a conductive axis, the magnetic resistor at least partially surrounds the conductive axis to define an outer surface of the magnetic resistor, and the second terminal comprises at least a portion of the outer surface.

MRAM cells according to other embodiments of the invention include an integrated circuit substrate, an access transistor in the integrated circuit substrate, at a face thereof, and a conductive axis on the integrated circuit substrate, including a first end that is adjacent and connected to the access transistor, and a second end that is remote from the access transistor. A magnetic resistor at least partially surrounds the conductive axis between the first and second ends thereof. A bit line is connected to the second end of the conductive axis and extends along a direction that is parallel to the face. A reading word line is connected to the magnetic resistor and also extends along the direction that is parallel to the face. In other embodiments, a word line is connected to the access transistor and also extends along a direction that is parallel to the face. In still other embodiments, the bit line extends along a first direction that is parallel to the face and the reading word line extends along a second direction that is also parallel to the face but is different from the first direction.

In still other embodiments, the magnetic resistor includes a first ferromagnetic layer that at least partially surrounds the conductive axis, a tunneling insulation layer that at least partially surrounds the first ferromagnetic layer and a second ferromagnetic layer that at least partially surrounds the tunneling insulation layer. The first ferromagnetic layer is connected to the conductive axis and the second ferromagnetic layer is connected to the reading word line. In some embodiments, the first ferromagnetic layer, the tunneling insulating layer and the second ferromagnetic layer are coaxial and may be polygonal or nonpolygonal in cross-section. Each of these elements also may be of uniform or non-uniform cross-sectional size along the conductive axis.

A reading word line electrode also may be provided in some embodiments, that at least partially surrounds the second ferromagnetic layer and that is connected to the second ferromagnetic layer.

Still other embodiments of the present invention provide methods of operating an MRAM cell that includes a magnetic resistor including first and second terminals, an access transistor that is connected to the first terminal, a bit line that also is connected to the first terminal and a reading word line that is connected to the second terminal. In these embodiments, the MRAM cell is written by turning on the access transistor to force writing current into the first terminal and thereby change the resistance of the magnetic resistor. Reading is performed by applying voltage between the bit line and the reading word line, and sensing current through the magnetic resistor in response thereto. In other embodiments, writing is performed by activating the word line to turn on the access transistor. In still other embodiments, writing is performed by turning on the access transistor to force writing current into the conductive axis, and thereby change the resistance of the magnetic resistor.

DETAILED DESCRIPTION OF PREFERRED EMBODIMENTS

Figure 1:
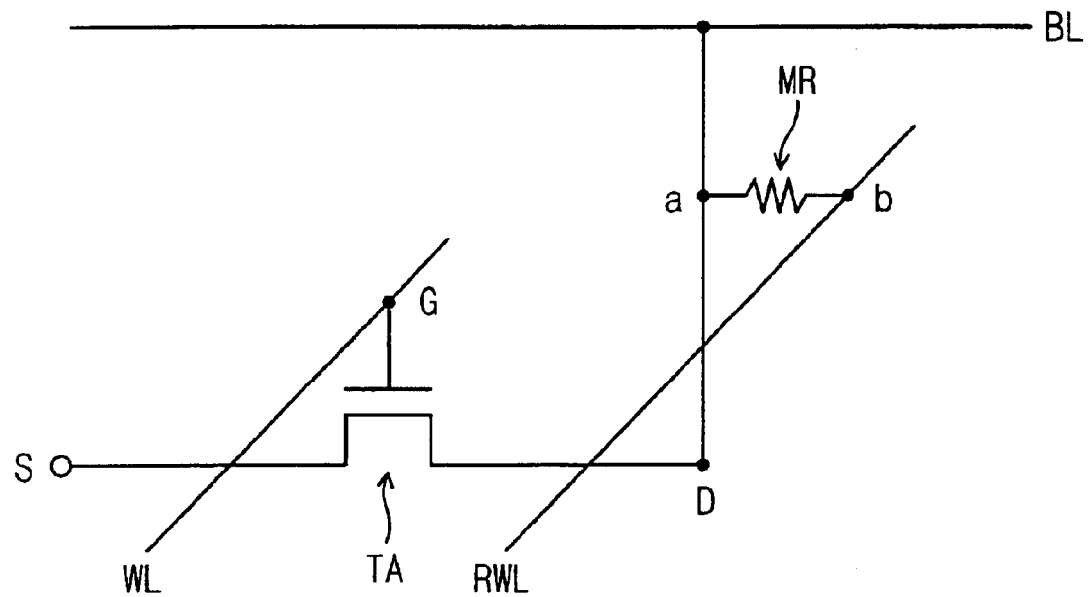
FIG. 1 is a circuit diagram of an MRAM cell according to embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, each embodiment described and illustrated herein includes its complementary conductivity type embodiment as well.

FIG. 1 is a circuit diagram of MRAM cells according to embodiments of the present invention. As shown in FIG. 1, an MRAM cell includes a Magnetic Resistor (MR) including first and second terminals a and b, respectively. An access transistor TA is connected to the first terminal a. A bit line BL also is connected to the first terminal a. A reading word line RWL is connected to the second terminal b, and a word line WL is connected to the access transistor.

As also shown in FIG. 1, the access transistor may be a Field Effect Transistor (FET). The access transistor includes a controlling electrode such as a gate G, and first and second controlled electrodes, such as a source S and a drain D. As shown in FIG. 1, the word line WL is connected to the gate G, and the first terminal a and the bit line BL are connected to the second controlled electrode D. As also shown in FIG. 1, the bit line BL extends along a first direction and the word line WL and the reading word line RWL extend along a second direction that is different from the first direction. In some embodiments, the first and second directions are orthogonal, but they need not be so.

Figure 2:
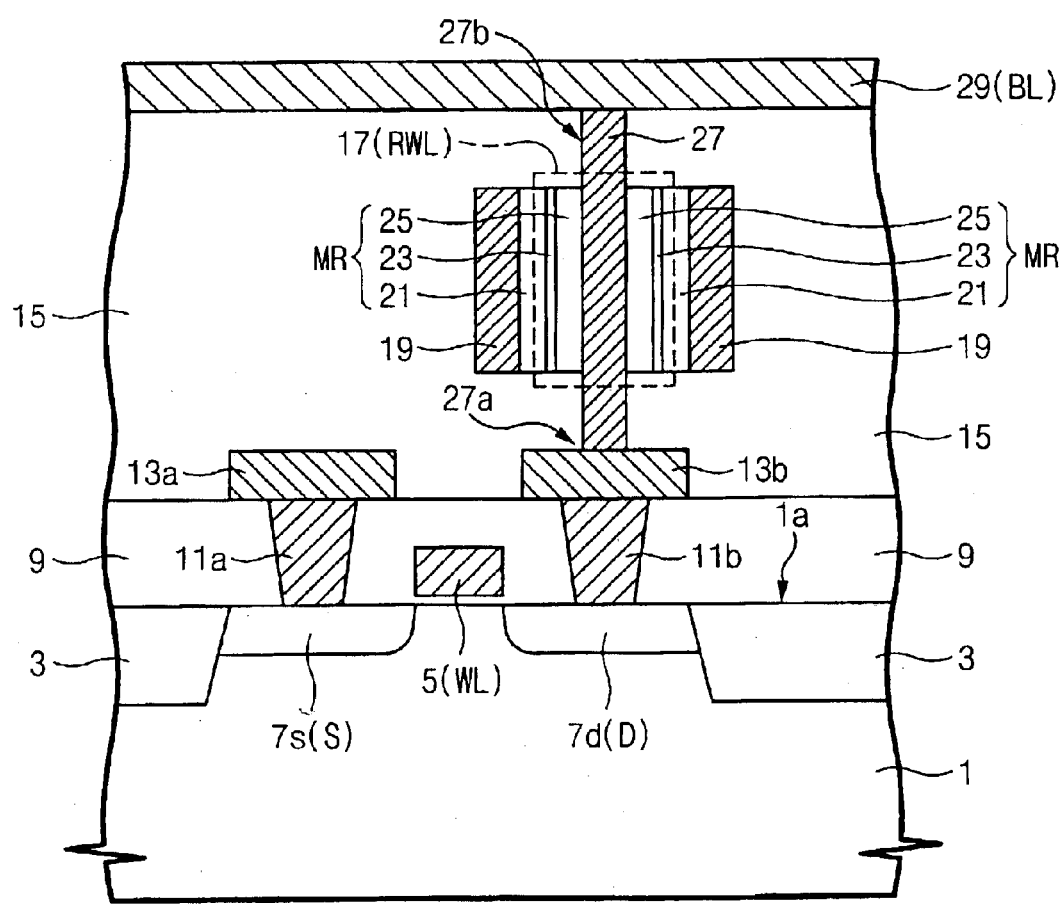
FIG. 2 is a cross-sectional view of integrated circuit MRAM cells according to embodiments of the present invention.

FIG. 2 is a cross-sectional view of integrated circuit MRAM cells according to embodiments of the present invention. As shown in FIG. 2, these integrated circuit MRAM cells include an integrated circuit substrate 1, such as a silicon semiconductor substrate, including one or more isolation regions 3 that define an active region. The access transistor TA of FIG. 1 is formed in the active region. In FIG. 2, the access transistor TA is a Metal Oxide Semiconductor Field Effect Transistor (MOSFET) having a gate 5(WL), a source 7s(S) and a drain 7d(D). As shown in FIG. 2, the gate 5(WL) extends along a direction that crosses over the active region, i.e., in a direction into and out of the plane of FIG. 2, to thereby provide a word line WL. A lower interlayer insulating layer 9 is provided on a face 1a of the integrated circuit substrate 1. A first contact plug 11a and a second contact plug 11b extend through the lower interlayer insulation layer 9. The first contact plug 11a is connected to the source region 7s(S) and the second contact plug 11b is connected to the drain region 7d(D). A source line 13a and a contact pad 13b are provided on the lower interlayer insulation layer 9. The source line 13a is connected to the first contact plug 11a and the contact pad 13b is connected to the second contact plug 11b.

Still continuing with the description of FIG. 2, an upper interlayer insulation layer 15 is provided on the lower interlayer insulation layer 9 including on the source line 13a and the contact pad 13b. A conductive axis 27 extends through the upper insulation layer 15. As shown in FIG. 2, the conductive axis 27 includes a first end 27a that is adjacent and connected to the access transistor, and in some embodiments to the drain 7d(D) of the access transistor, and a second end 27b that is remote from the access transistor. The conductive axis 27 need not be straight, but rather may be curved and/or segmented.

In FIG. 2, the first end 27a of the conductive axis 27 is connected to the contact pad 13b, and the bit line 29(BL) is connected to the second end 27b of the conductive axis 27. The conductive axis 27 provides the first terminal (a of FIG. 1) of the magnetic resistor MR. The magnetic resistor MR, which will be described in detail below, at least partially surrounds the conductive axis 27 between the first end 27a and the second end 27b thereof. The bit line 29(BL) extends along a direction that is parallel to the face 1a. A reading word line 17(RWL) also is connected to the magnetic resistor and also extends along a direction that is parallel to the face 1a. The word line 5(WL) also extends along a direction that is parallel to the face. In particular, as shown in FIG. 2, the bit line 29(BL) extends along a first direction that is parallel to the face, for example in or parallel to the plane of FIG. 2, whereas the reading word line 17(RWL) and the word line 5(WL) extend along a second direction that is also parallel to the face but is different from the first direction, for example orthogonal to (into and out of) the plane of FIG. 2. In still other embodiments, the first and second directions need not be orthogonal.

Continuing with the description of FIG. 2, the magnetic resistor MR includes a first ferromagnetic layer 25 that at least partially surrounds the conductive axis 27. The magnetic resistor MR also includes a tunneling insulation layer 23 that at least partially surrounds the first ferromagnetic layer 25. The magnetic resistor MR also includes a second ferromagnetic layer 21 that at least partially surrounds the tunneling insulation layer 23. As shown in FIG. 2, the first ferromagnetic layer 25 is connected to the conductive axis 27. The second ferromagnetic layer 21 is connected to the reading word line 17(RWL). In some embodiments, a reading word line electrode 19 is provided that at least partially surrounds the second ferromagnetic layer 21, and the reading word line 17(RWL) is connected to the reading word line electrode 19, to thereby connect the second ferromagnetic layer 21 to the reading word line 17(RWL).

In some embodiments, the first ferromagnetic layer 25 is compositionally different from the second ferromagnetic layer 21. In some embodiments, the coercive magnetic field of the first ferromagnetic layer 25 is different from that of the second ferromagnetic layer 21. As is well known to those having skill in the art, the coercive magnetic field is the minimum magnetic field that is needed for magnetization of the ferromagnetic layer.

Figure 3A:
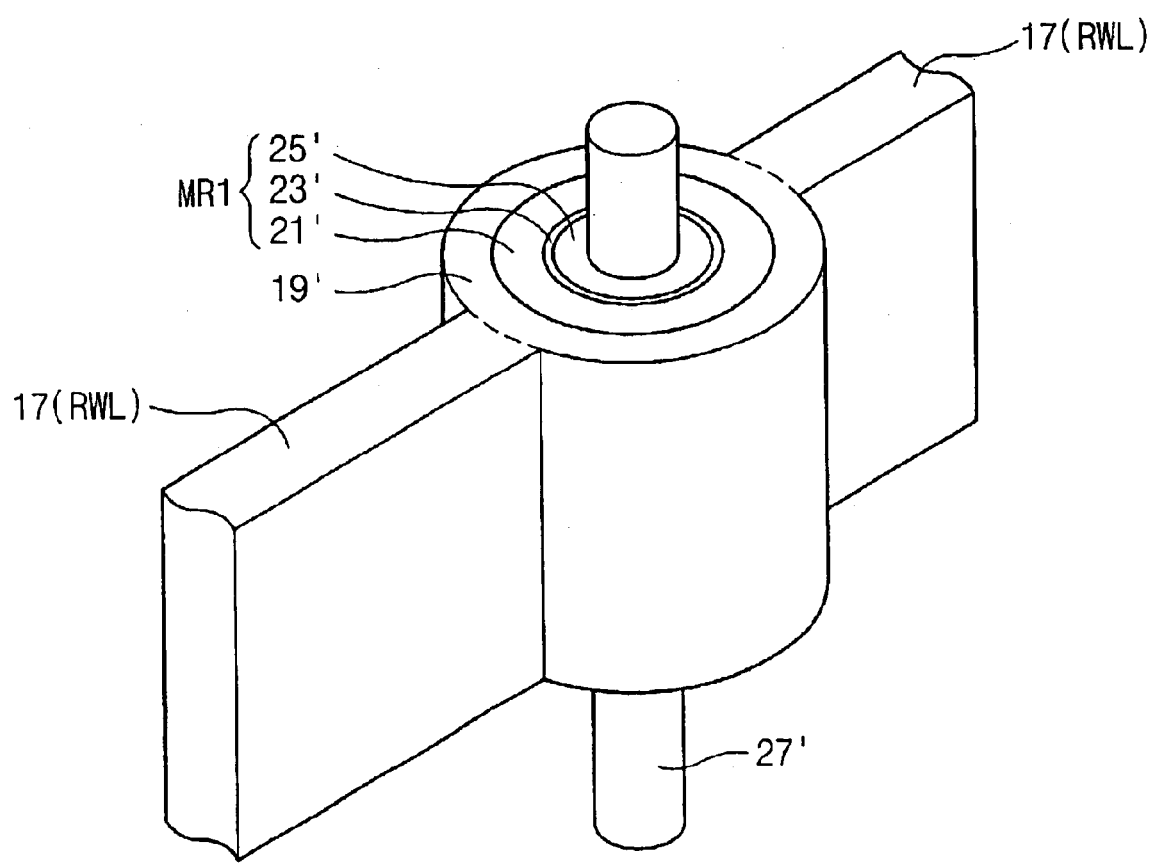
FIGS. 3A and 3B are perspective views of magnetic resistors for MRAM cells according to embodiments of the present invention.
Figure 3B:
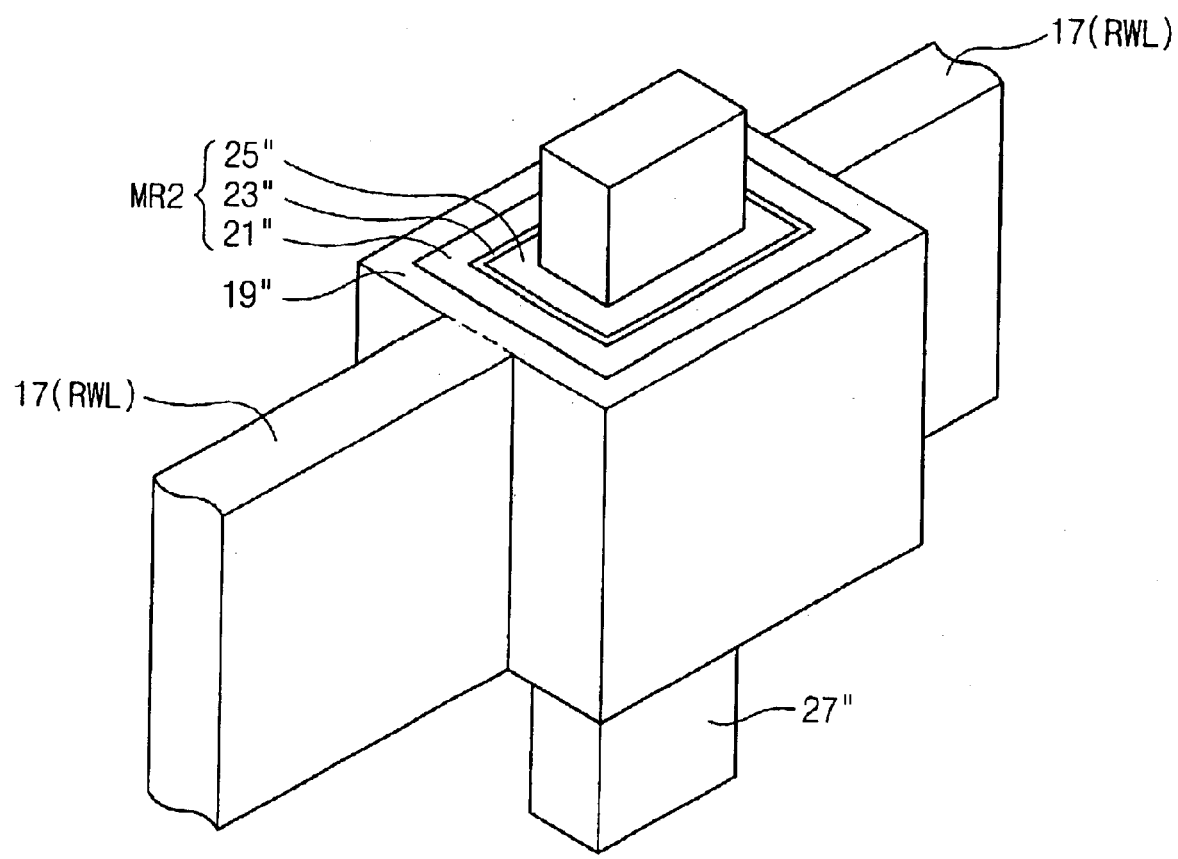

The magnetic resistor MR of FIG. 2 may have various shapes. In particular, as will now be described in connection with FIGS. 3A and 3B, in some embodiments, the first ferromagnetic layer, the tunneling insulating layer and the second ferromagnetic layer are coaxial and are nonpolygonal in cross-section, as shown in FIG. 3A. For example, circular, elliptical, teardrop shape and/or other nonpolygonal cross-sectional shapes may be used. Moreover, in other embodiments as shown in FIG. 3B, the conductive axis, the first ferromagnetic layer, the tunneling insulating layer and the second ferromagnetic layer are coaxial and are all polygonal in cross-section (for example, square, rectangular, hexagonal, etc.). Moreover, the first ferromagnetic layer, the tunneling insulating layer and the second ferromagnetic layer each may be of uniform cross-sectional size along the conductive axis, as shown in FIGS. 3A and 3B, or may be of non-uniform cross-sectional size along the conductive axis.

More specifically, referring to FIG. 3A, nonpolygonal embodiments of magnetic resistors MR1 include a conductive axis 27' that is shaped as a circular pillar, and the magnetic resistor MR1 surrounding the circular conductive axis 27' has a cylindrical shape. Thus, the magnetic resistor MR1 includes a first cylindrical ferromagnetic layer 25' that at least partially surrounds, and in FIG. 3A fully surrounds, the conductive axis 27', a cylindrical tunneling insulation layer 23' that at least partially surrounds, and in FIG. 3A fully surrounds, the first ferromagnetic layer 25' and a second cylindrical ferromagnetic layer 21' that at least partially surrounds, and in FIG. 3A fully surrounds, the tunneling insulating layer 23'. In addition, as shown in FIG. 3A, a cylindrical reading word line 19' may at least partially surround, and in FIG. 3A may fully surround, the second ferromagnetic layer 21'. In FIG. 3A, the diameters of the conductive axis 27', the first ferromagnetic layer 25', the tunnel insulating layer 23' and the second ferromagnetic layer 21' are uniform along the conductive axis 27'. However, they may be non-uniform in other embodiments.

Referring now to FIG. 3B, polygonal embodiments of conductive axes and magnetic resistors are shown. Thus, in FIG. 3B, the conductive axis 27" is in the form of a square pillar. The magnetic resistor MR2 that at least partially surrounds the conductive axis 27" has a rectangular cross-section and includes a first ferromagnetic layer 25" that at least partially surrounds, and is shown as fully surrounding, the conductive axis 27", a rectangular tunneling insulating layer 23" that at least partially surrounds, and is shown as fully surrounding, the first ferromagnetic layer 25", and a second ferromagnetic layer 21" that at least partially surrounds, and is shown as fully surrounding, the tunneling insulating layer 23". In addition, a rectangular word line electrode 19" at least partially surrounds, and is shown as fully surrounding, the second ferromagnetic layer 21", and is connected to the reading word line 17(RWL). Other polygonal shapes may be used. Also, as was the case in FIG. 3A, the cross-sectional size of the magnetic resistor MR2 along the length of the conductive axis 27" may be uniform or non-uniform.

Referring again to FIGS. 1 and 2, methods of operating an MRAM cell according to embodiments of the present invention now will be described. In general, the MRAM cell is written by turning on the access transistor TA to force writing current into the first terminal a, and thereby change the resistance of the magnetic resistor MR. Reading the MRAM cell is performed by applying voltage between the bit line BL and the reading word line RWL, and sensing current through the magnetic resistor MR in response thereto. The access transistor may be turned on by activating the word line WL which is connected to the gate G of the access transistor TA. As shown in FIG. 2, the turning on of the access transistor TA forces writing current into the conductive axis 27, to thereby change the resistance of the magnetic resistor MR.

More specifically, in some embodiments, writing is performed by turning on the access transistor TA and forcing writing current into the conductive axis 27, to control the electric resistance of the magnetic resistor MR that surrounds the conductive axis 27. Writing current may be generated by applying a writing voltage between the source line 13a and the bit line 29(BL). The writing current changes a magnetic polarization of first or second ferromagnetic layers 25 and 21.

For example, assume that the first ferromagnetic layer 25, the magnetic polarization of which can be changed, is a free layer and the second ferromagnetic layer 21, the magnetic polarization of which cannot be changed, is a pinned layer, and a minimum magnetic field intensity for changing the magnetic polarization of the free layer is referred to as the intensity of a coercive magnetic field. If an applied magnetic field has greater intensity than that of a coercive magnetic field and has the opposite direction to a magnetic polarization of the first ferromagnetic layer 25, the magnetic polarization of the first ferromagnetic layer 25 is changed. The intensity of a coercive magnetic field may vary based on whether or not the applied magnetic field has a parallel direction with a magnetic polarization of the first ferromagnetic layer 25. In addition, the intensity of a coercive magnetic field may be dependent on a physical structure of the magnetic resistor and/or a kind of material used thereof.

The intensity and direction of the applied magnetic field are dependent on the magnitude and direction of the current passing through the conductive axis 27. Therefore, in order to change the information stored in the magnetic memory according to some embodiments of the present invention, in other words, in order to change the information stored in the free layer 25b, a method for changing the direction of the current passing through the conductive axis 27 can be used.

In brief it is possible to change the relative relationship of a magnetic polarization between the free layer and the pinned layer by controlling directions of the current passing through the conductive axis 27. If the magnetic polarization of the free layer has a parallel direction with that of the pinned layer, the resistance of the magnetic resistor becomes low or minimum. If the magnetic polarization of the free layer has an anti-parallel direction with that of the pinned layer, the resistance of the magnetic resistor becomes high or maximum. A mechanism for storing information of the magnetic memory according to some embodiments of the present invention utilizes the difference of the resistances. According to other embodiments of the present invention, the first and the second ferromagnetic layers 25 and 21 may be a pinned layer and a free layer, respectively.

Reading may be performed by applying a read voltage between the bit line 29(BL) connected to the first terminal a of the magnetic resistor MR and the reading word line 17(RWL) connected to the second terminal b of the magnetic resistor MR, and sensing the electric signal of the bit line 29, such as bit line voltage or bit line current. Thus, current through the magnetic resistor MR is sensed. The read voltage is sufficiently low so as to not change a magnetic polarization of the magnetic resistor MR. The bit line signal may be detected using a sense amplifier that is connected to the bit line 29. The access transistor TA may be turned off during the reading operation in some embodiments. However, if the source line 13a is floating, the access transistor may remain turned on.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A Magnetic Random Access Memory (MRAM) cell comprising:
   a magnetic resistor including first and second terminals;
   an access transistor that is connected to the first terminal;
   a bit line that also is connected to the first terminal;
   a reading word line that is connected to the second terminal; and
   a word line that is connected to the access transistor.

2. An MRAM cell according to claim 1 wherein the access transistor includes a controlling electrode and first and second controlled electrodes, wherein the word line is connected to the controlling electrode and wherein the first terminal and the bit line are connected to the second controlled electrode.

3. An MRAM cell according to claim 1 wherein the access transistor is a Field Effect Transistor (FET) including a source, a drain and a gate, and wherein the word line is connected to the gate and wherein the first terminal and the bit line are connected to the drain.

4. An MRAM cell according to claim 1 wherein the bit line extends along a first direction and wherein the word line and the reading word line extend along a second direction that is different from the first direction.

5. An MRAM cell according to claim 1 wherein the first terminal comprises a conductive axis, wherein the magnetic resistor at least partially surrounds the conductive axis to define an outer surface of the magnetic resistor, and wherein the second terminal comprises at least a portion of the outer surface.

6. An MRAM cell according to claim 5 wherein the magnetic resistor comprises:
   a first ferromagnetic layer that at least partially surrounds the conductive axis;
   a tunneling insulation layer that at least partially surrounds the first ferromagnetic layer; and
   a second ferromagnetic layer that at least partially surrounds the tunneling insulation layer;
   wherein the first ferromagnetic layer is connected to the conductive axis and wherein the second ferromagnetic layer is connected to the reading word line.

7. An MRAM cell according to claim 6 wherein the conductive axis, the first ferromagnetic layer, the tunneling insulation layer and the second ferromagnetic layer are all polygonal in cross-section.

8. An MRAM cell according to claim 6 wherein the conductive axis, the first ferromagnetic layer, the tunneling insulation layer and the second ferromagnetic layer are all nonpolygonal in cross-section.

9. An MRAM cell according to claim 6 wherein each of the conductive axis, the first ferromagnetic layer, the tunneling insulation layer and the second ferromagnetic layer is of uniform or non-uniform cross-sectional size along the conductive axis.

10. An MRAM cell according to claim 6 further comprising a reading word line electrode that at least partially surrounds the second ferromagnetic layer and wherein the reading word line is connected to the reading word line electrode.

11. A Magnetic Random Access Memory (MRAM) cell comprising:
    an integrated circuit substrate;
    an access transistor in the integrated circuit substrate, at a face thereof;
    a conductive axis on the integrated circuit substrate, including a first end that is adjacent and connected to the access transistor and a second end that is remote from the access transistor;
    a magnetic resistor that at least partially surrounds the conductive axis between the first and second ends thereof;
    a bit line that is connected to the second end of the conductive axis and that extends along a direction that is parallel to the face; and
    a reading word line that is connected to the magnetic resistor and that also extends along a direction that is parallel to the face.

12. An MRAM cell according to claim 11 further comprising:
    a word line that is connected to the access transistor and that also extends along a direction that is parallel to the face.

13. An MRAM cell according to claim 12 wherein the access transistor includes a controlling electrode and first and second controlled electrodes, wherein the word line is connected to the controlling electrode and wherein the first end is connected to the second controlled electrode.

14. An MRAM cell according to claim 12 wherein the access transistor is a Field Effect Transistor (FET) including a source, a drain and a gate, and wherein the word line is connected to the gate and wherein the first end is connected to the drain.

15. An MRAM cell according to claim 11 wherein the bit line extends along a first direction that is parallel to the face and wherein the reading word line extends along a second direction that is also parallel to the face but is different from the first direction.

16. An MRAM cell according to claim 11 wherein the magnetic resistor comprises:
   a first ferromagnetic layer that at least partially surrounds the conductive axis;
   a tunneling insulation layer that at least partially surrounds the first ferromagnetic layer; and
   a second ferromagnetic layer that at least partially surrounds the tunneling insulation layer;
   wherein the first ferromagnetic layer is connected to the conductive axis and wherein the second ferromagnetic layer is connected to the reading word line.

17. An MRAM cell according to claim 16 wherein the conductive axis, the first ferromagnetic layer, the tunneling insulation layer and the second ferromagnetic layer are all polygonal in cross-section.

18. An MRAM cell according to claim 16 wherein the conductive axis, the first ferromagnetic layer, the tunneling insulation layer and the second ferromagnetic layer are all nonpolygonal in cross-section.

19. An MRAM cell according to claim 16 wherein each of the conductive axis, the first ferromagnetic layer, the tunneling insulation layer and the second ferromagnetic layer is of uniform or non-uniform cross-sectional size along the conductive axis.

20. An MRAM cell according to claim 16 further comprising a reading word line electrode that at least partially surrounds the second ferromagnetic layer and wherein the reading word line is connected to the reading word line electrode.

21. A method of operating a Magnetic Random Access Memory (MRAM) cell that comprises a magnetic resistor including first and second terminals, an access transistor that is connected to the first terminal, a bit line that also is connected to the first terminal and a reading word line that is connected to the second terminal, the method comprising:
   writing the MRAM cell by turning on the access transistor to force writing current into the first terminal and thereby change resistance of the magnetic resistor; and
   reading the MRAM cell by applying voltage between the bit line and the reading word line and sensing current through the magnetic resistor in response thereto.

22. A method according to claim 21 wherein the MRAM cell further comprises a word line that is connected to the access transistor, the writing comprising:
   writing the MRAM cell by activating the word line to turn on the access transistor.

23. A method according to claim 22 wherein the access transistor includes a controlling electrode and first and second controlled electrodes and wherein the first terminal and the bit line are connected to the second controlled electrode, the writing comprising:
   writing the MRAM cell by applying voltage between the bit line and the first controlled electrode.

24. A method according to claim 22 wherein the access transistor includes a controlling electrode and first and second controlled electrodes, wherein the word line is connected to the controlling electrode and wherein the first terminal and the bit line are connected to the second controlled electrode.

25. A method according to claim 22 wherein the access transistor is a Field Effect Transistor (FET) including a source, a drain and a gate, and wherein the word line is connected to the gate and wherein the first terminal and the bit line are connected to the drain.

26. A method according to claim 21:
   wherein the first terminal comprises a conductive axis having first and second ends, wherein the first end is connected to the access transistor and the second end is connected to the bit line and wherein the magnetic resistor at least partially surrounds the conductive axis between the first and second ends thereof;
   the writing comprising writing the MRAM cell by turning on the access transistor to force writing current into the conductive axis and thereby change resistance of the magnetic resistor.

27. A method according to claim 26 wherein the magnetic resistor comprises:
   a first ferromagnetic layer that at least partially surrounds the conductive axis;
   a tunneling insulation layer that at least partially surrounds first ferromagnetic layer; and
   a second ferromagnetic layer that at least partially surrounds the tunneling insulation layer;
   wherein the first ferromagnetic layer is connected to the conductive axis and wherein the second ferromagnetic layer is connected to the reading word line.

28. A method according to claim 21 wherein the voltage that is applied between the bit line and the reading word line is sufficiently low so as to not change a magnetic polarization of the magnetic resistor.

* * * * *